United States Patent
Park

(10) Patent No.: US 11,347,633 B2
(45) Date of Patent: May 31, 2022

(54) DATA STORAGE SYSTEM AND PRECHARGE POLICY SETTING METHOD THEREFOR

(71) Applicant: SK hynix Inc., Gyeonggi-do (KR)

(72) Inventor: Chan Jin Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 80 days.

(21) Appl. No.: 16/673,637

(22) Filed: Nov. 4, 2019

(65) Prior Publication Data
US 2020/0233795 A1 Jul. 23, 2020

(30) Foreign Application Priority Data
Jan. 18, 2019 (KR) .................. 10-2019-0006686

(51) Int. Cl.
*G06F 12/02* (2006.01)
*G11C 11/408* (2006.01)

(52) U.S. Cl.
CPC .......... *G06F 12/02* (2013.01); *G11C 11/4085* (2013.01); *G06F 2212/1028* (2013.01)

(58) Field of Classification Search
CPC ............. G06F 12/02; G06F 2212/1028; G11C 11/4085

USPC ........................................................ 711/154
See application file for complete search history.

(56) References Cited

U.S. PATENT DOCUMENTS

| | | | |
|---|---|---|---|
| 2005/0081002 A1* | 4/2005 | Chang .................. | G06F 1/3225 711/154 |
| 2013/0173864 A1* | 7/2013 | Kajigaya ............. | G06F 12/0891 711/144 |
| 2014/0068203 A1* | 3/2014 | Son ......................... | G06F 3/068 711/155 |

FOREIGN PATENT DOCUMENTS

KR       1020110059764       6/2011

* cited by examiner

*Primary Examiner* — Hua J Song
(74) *Attorney, Agent, or Firm* — IP & T Group LLP

(57) ABSTRACT

A data storage system includes a memory device including a plurality of memory cells which are coupled to a plurality of row lines, and configured to communicate with a host device through at least one port; and a memory controller configured to select one of a first precharge policy and a second precharge policy according to a precharge control signal, and control the row lines based on access addresses for the row lines according to the selected precharge policy, wherein, under the first precharge policy, one of a first precharge scheme and a second precharge scheme is applied, and under the second precharge policy, both the first and second precharge schemes are applied at different times.

9 Claims, 9 Drawing Sheets

DATA STORAGE SYSTEM AND PRECHARGE POLICY SETTING METHOD THEREFOR

CROSS-REFERENCE TO RELATED APPLICATION

The present application claims priority under 35 U.S.C. § 119(a) to Korean application number 10-2019-0006686, filed on Jan. 18, 2019, in the Korean Intellectual Property Office, which is incorporated herein by reference in its entirety.

BACKGROUND

1. Technical Field

Various embodiments generally relate to a semiconductor integrated device, and more particularly, to a data storage system and a precharge policy setting method therefor.

2. Related Art

A semiconductor memory device may include a plurality of memory cells which are coupled at respective intersections of row lines and column lines. The memory cells may be divided into a plurality of sub regions each including a respective subset of the plurality of memory cells.

The semiconductor memory device may write or read data in specific memory cells according to a request of a host. That is, the semiconductor memory device may write or read data by accessing specific column lines, after activating a specific sub region in which a row line requested by the host is included, by the row line.

How to manage the state of a sub region after processing data by accessing row/column lines may be determined by a precharge scheme in a memory controller.

An open precharge scheme may direct a scheme of maintaining a sub region including a specific row line in an active state after processing data by accessing the corresponding row line. In other words, the open precharge scheme may direct maintaining a specific row line of a specific sub region in an active state after processing data by activating the corresponding sub region by the corresponding row line.

A closed precharge scheme may direct a scheme of precharging a sub region including a specific row line after processing data by activating the corresponding row line. That is, the closed precharge scheme may direct transitioning a specific row line from an active state to a precharge state (i.e., a stand-by state) after processing data by activating a specific sub region by the corresponding row line.

It is the norm that a precharge scheme for managing a sub region is initially fixed to an initial state.

Depending on an access pattern of a host device to a memory device, a sub region may maintain an active state or a precharge state or may repeatedly transition between an active state and a precharge state.

In this regard, in order to change the state of a sub region between a standby state and an active state, power consumption is necessary. In particular, more power may be consumed for transition from a precharge state to an active state. Therefore, determining a precharge scheme for a sub region may serve as a key factor that determines the performance of a semiconductor memory device such as a power consumption amount and a processing speed.

SUMMARY

In an embodiment, a data storage system may include: a memory device including a plurality of memory cells which are coupled to a plurality of row lines, the memory cells divided into a plurality of sub regions each including at least one of the row lines, and the memory device configured to communicate with a host device through a plurality of ports which are a communication channel between the host device and the memory device; and a memory controller configured to set a first precharge scheme for each of the plurality of ports, select one of a first precharge policy and a second precharge policy according to the first precharge scheme and a policy control signal, and control the row lines according to the selected precharge policy, wherein, the first precharge policy is configured to set the first precharge scheme as a current precharge scheme, and the second precharge policy is configured to maintain the first precharge scheme or change to another precharge scheme to set the current precharge scheme. The memory controller is configured to maintain or change the current precharge scheme to the other precharge scheme based on an access count for a sub region in which a specific row line is included.

In an embodiment, a precharge policy setting method of a data storage system including a memory device which includes a plurality of memory cells coupled to a plurality of row lines, the memory device divided into a plurality of sub regions each including at least one of the row lines, and the memory device communicating with a host device through a plurality of ports which are a communication channel between the host device and the memory device, the method comprising: setting a first precharge scheme for each of the plurality of ports; selecting one of a first precharge policy and a second precharge policy according to the first precharge scheme and a policy control signal; and controlling the row lines according to the selected precharge policy, wherein, the first precharge policy is configured to set the first precharge scheme as a current precharge scheme, and the second precharge policy is configured to maintain the first precharge scheme or change to another precharge scheme to set the current precharge scheme. The method further comprises maintaining or changing the current precharge scheme to the other precharge scheme based on an access count for a sub region in which a specific row line is included.

In an embodiment, a memory system may include: a memory device including a cell array defined by intersecting row and column lines; and a controller configured to control the memory device to operate according to one of a first precharge scheme and a second precharge scheme on a row line selected from among the row lines according to a pattern of access to the selected row line and an initial precharge scheme, which is one of the first and second precharge schemes, initially performed on the selected row line.

DETAILED DESCRIPTION

A data storage system and a precharge policy setting method therefor is described below with reference to the accompanying drawings through various embodiments. Note that, throughout the specification, reference to "an embodiment" or the like is not necessarily to only one embodiment, and different references to any such phrase are not necessarily to the same embodiment(s).

Figure 1:
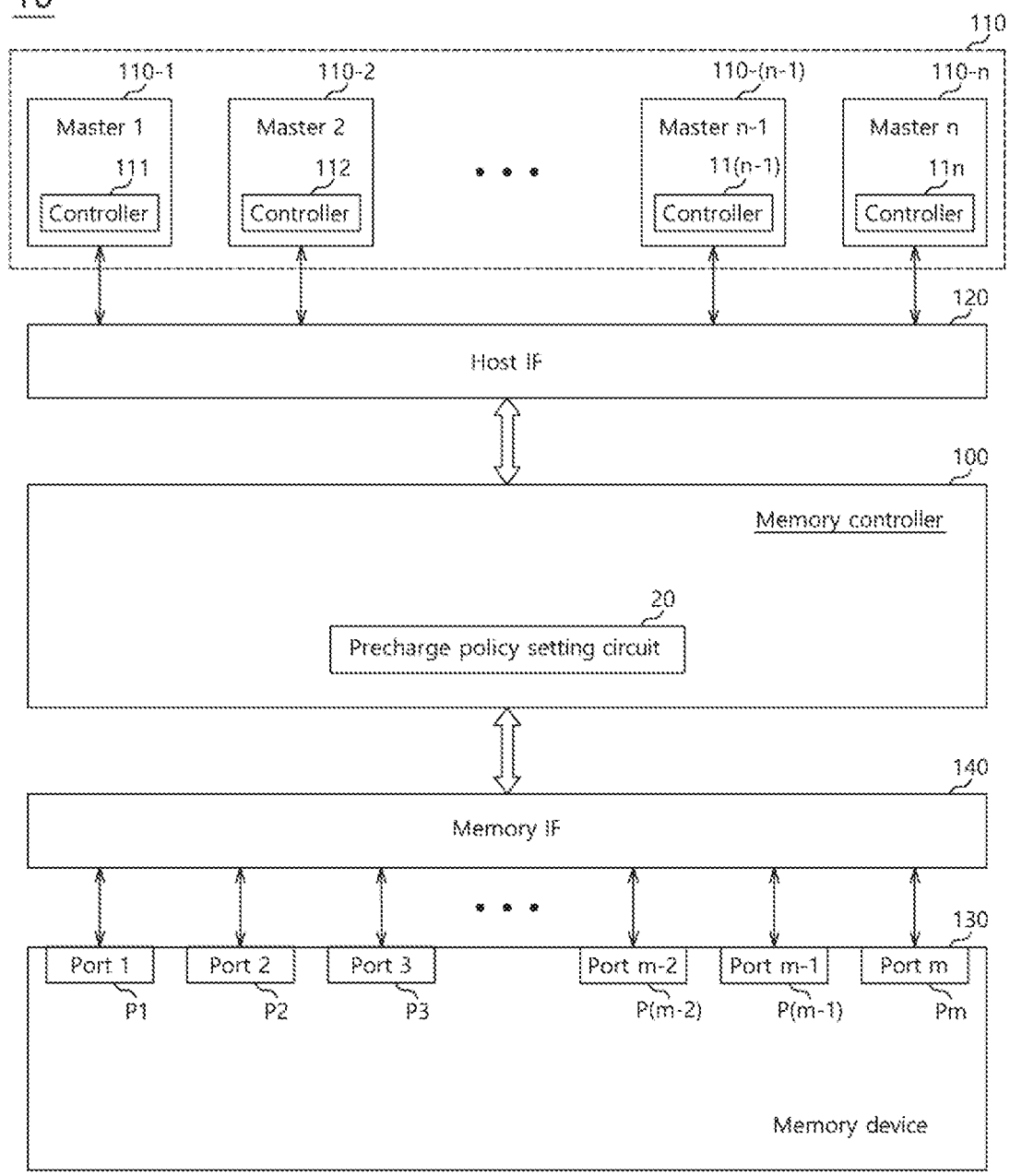
FIG. 1 is a schematic diagram illustrating a configuration of a data storage system in accordance with an embodiment of the present invention.

FIG. 1 is a schematic diagram illustrating a configuration of a data storage system in accordance with an embodiment.

Referring to FIG. 1, a data storage system 10 may include a memory controller 100, a host device 110, a host interface 120, a memory device 130 and a memory interface 140.

The host device 110 may generate a host signal including a control signal, a command, data, and the like. The host signal may be provided to the memory controller 100 through the host interface 120.

The host device 110 may include one or more master devices 110-1 to 110-n, which may include controllers 111 to 11n, respectively. Each of the master devices 110-1 to 110-n may be an application processor, a multimedia processor, a MODEM, an image processor, or the like, but it is to be noted that the embodiment is not limited thereto.

The memory controller 100 may analyze and process a host signal which is provided from the host device 110 through the host interface 120. The memory controller 100 may control operations of background function blocks based on firmware or software for driving the data storage system 10.

The memory device 130 may include one or more ports P1 to Pm and a memory core.

Each of the ports P1 to Pm may be a communication channel between the host device 110 and the memory device 130, and is configured to receive a control signal, a command and data which are outputted from any of the master devices 110-1 to 110-n.

Figure 2:
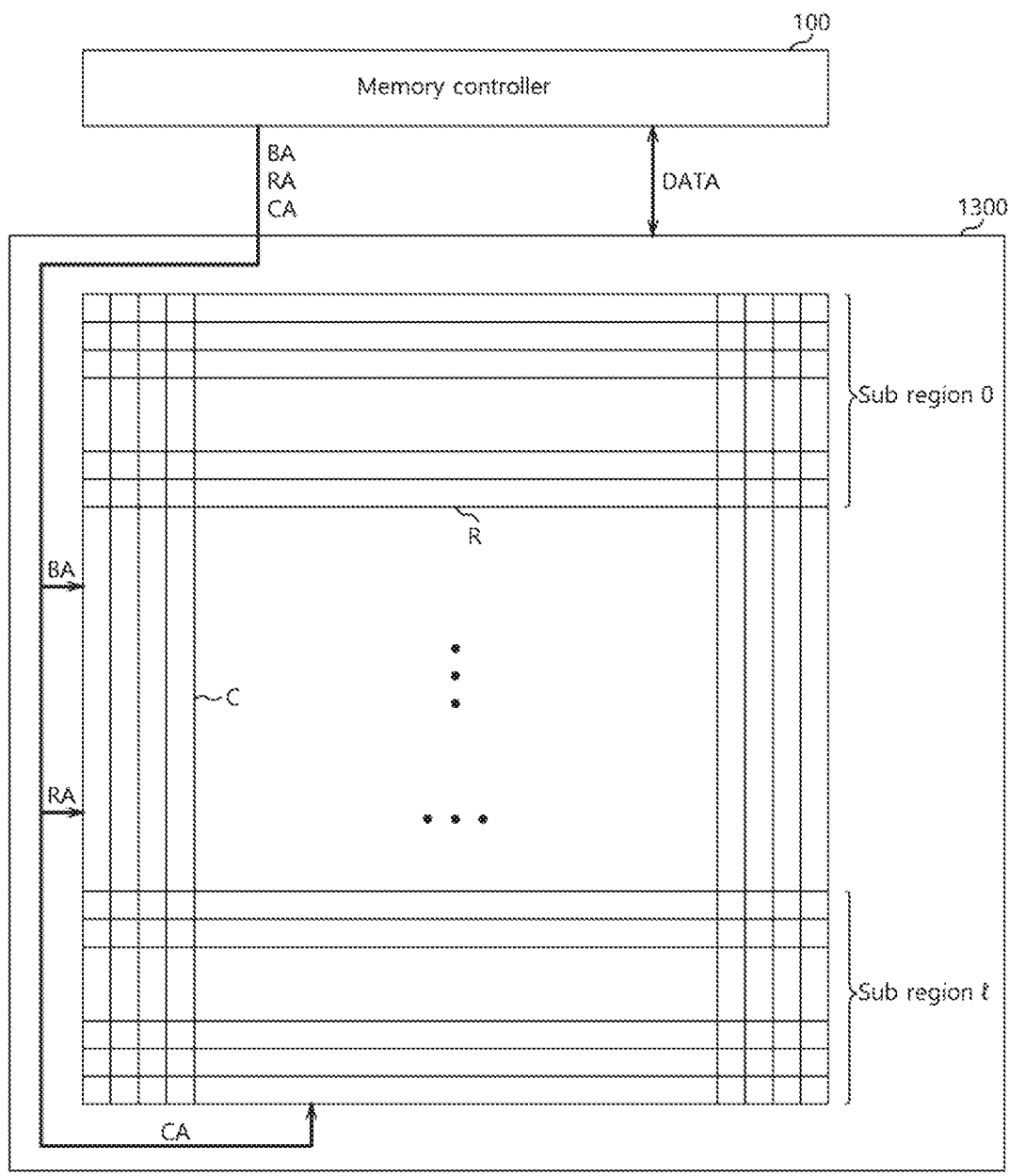
FIG. 2 is a schematic diagram illustrating a configuration of a memory device in accordance with an embodiment of the present invention.

FIG. 2 is a schematic diagram illustrating a configuration of a memory device in accordance with an embodiment.

Referring to FIG. 2, a memory core 1300 may include a plurality of memory cells at respective intersections of row lines R and column lines C. In an embodiment, the memory core 1300 may be divided into a plurality of sub regions 0 to I, each of which may include a plurality of pages. A page may be a set of memory cells which are coupled to one row line R.

The memory controller 100 may access a specific region of the memory core 1300 by generating a sub region select signal BA, a row select signal RA and a column select signal CA based on a control signal provided from the host device 110. Further, the memory controller 100 may exchange data DATA with a memory region which is accessed.

Referring back to FIG. 1, the memory interface 140 may serve as a path through which a control signal and a command are transmitted from the memory controller 100 to the memory device 130 and a data transmission/reception path between the memory device 130 and the memory controller 100.

In an embodiment, the memory controller 100 may include a precharge policy setting circuit 20 to determine a precharge scheme for the plurality of sub regions configured in the memory core 1300.

According to the precharge scheme, the memory controller 100 sets the state of a specific sub region into one of a precharge state and an active state after accessing the corresponding sub region.

The precharge scheme may be an open precharge scheme or a closed precharge scheme.

The open precharge scheme may operate to maintain a specific row line in an active state, after processing data, by accessing the specific row line. In other words, the open precharge scheme may maintain a sub region including a row line, which is accessed, in an active state.

The closed precharge scheme may operate to precharge a specific row line, after processing data, by accessing the corresponding row line. In other words, the closed precharge scheme may precharge a sub region including a row line which is accessed.

In an embodiment, the precharge policy setting circuit 20 may be configured to control a row line of the memory device 130 to execute one of the precharge schemes based on a specific precharge policy set at the time.

Initially, the memory device 130 may be set under a first precharge policy to operate to either the open precharge scheme or the closed precharge scheme, for at least one of the ports P1 to Pm.

Thereafter, in accordance with a second precharge policy, during operation of the memory device 130, the initial precharge scheme for at least one of the ports P1 to Pm may be maintained or dynamically changed to the other scheme according to an access address for the memory device 130 based on a request of the host device 110, a preset policy control signal and the initial precharge scheme.

In an embodiment, the one or more master devices 110-1 to 110-n may be configured to respectively correspond to the one or more ports P1 to Pm.

In an embodiment, the master devices 110-1 to 110-n may access the memory core 1300 with specific patterns through the ports P1 to Pm allocated thereto. For example, each of the master devices 110-1 to 110-n may have a pattern of continuously accessing the same page of the memory core 1300 through a specific port, accessing a page on time through a specific port or intermittently accessing a specific page.

Therefore, the precharge policy setting circuit 20 is provided with information on an initial precharge scheme (open or closed) set for each port and an address of the memory device 130 to be accessed through each port.

In the case where the policy control signal indicates to maintain the initial precharge scheme, the precharge policy setting circuit 20 may maintain such scheme during operation of the memory device 130 for each row line, that is, each page, until the policy control signal changes.

On the other hand, in the case where the policy control signal indicates to dynamically change the current precharge scheme, the precharge policy setting circuit 20 may dynamically change the current precharge scheme (open or closed) to the other and back again during operation of the memory device 130 for a row line corresponding to an address to be accessed.

Figure 3:
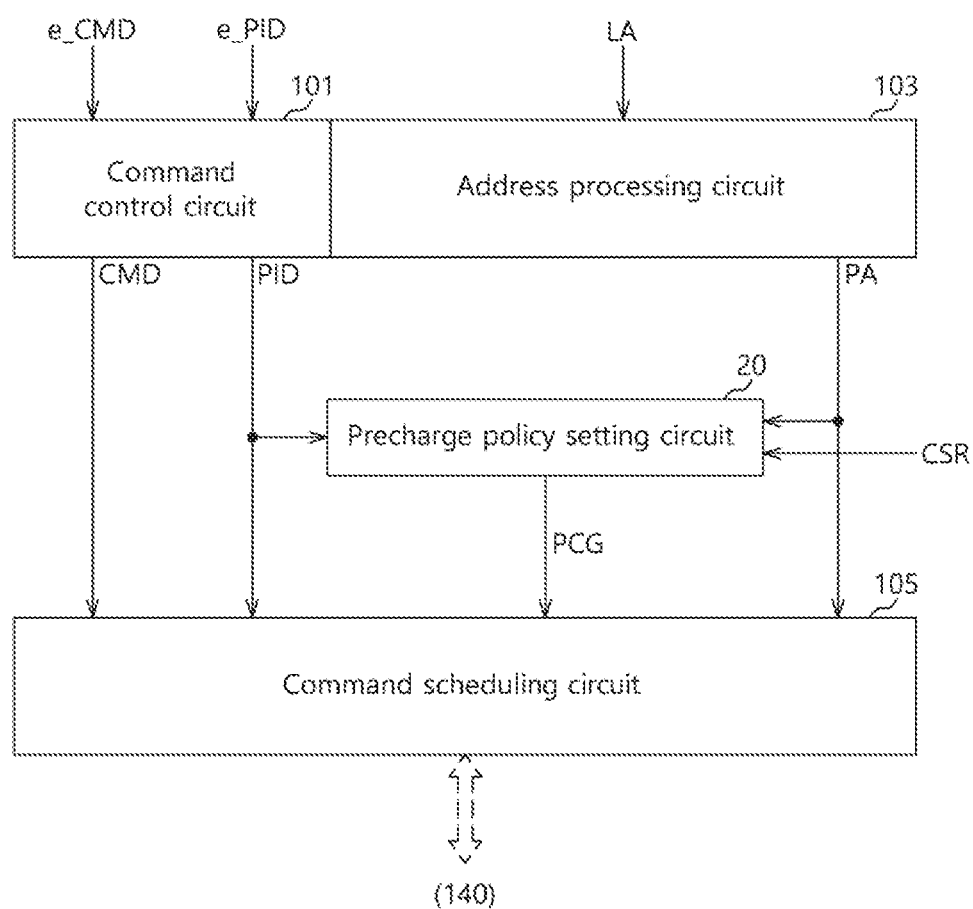
FIG. 3 is a schematic diagram illustrating a configuration of a memory controller in accordance with an embodiment of the present invention.

FIG. 3 is a schematic diagram illustrating a configuration of a memory controller in accordance with an embodiment.

Referring to FIG. 3, the memory controller 100 may include a command control circuit 101, an address processing circuit 103, a command scheduling circuit 105 and the precharge policy setting circuit 20.

The command control circuit 101 may decode an external command e_CMD provided from the host device 110 and thereby output an internal command signal CMD. In the case where the memory device 130 includes a plurality of ports, the command control circuit 101 may decode an external port ID e_PID provided from the host device 110 and thereby output a port identifier PID.

The address processing circuit 103 may receive a logical address LA from the host device 110, figure out a mapping relationship and thereby generate a physical address PA.

The precharge policy setting circuit 20 may be provided with the port identifier PID and the physical address PA, and may receive a per-port initial precharge scheme and a policy control signal from a state control register (SCR). Due to this fact, the precharge policy setting circuit 20 may determine a precharge scheme for a row line to be accessed by the host device 110, and accordingly, may generate a precharge signal PCG. The state control register (SCR) may store the per-port initial precharge scheme, and provide the per-port initial precharge scheme together with the policy control signal to the precharge policy setting circuit 20.

The command scheduling circuit 105 may be configured to schedule a command in response to the command signal CMD, the port identifier PID, the physical address PA and the precharge signal PCG and accordingly access the memory device 130 through the memory interface 140 to allow the command to be processed.

Figure 4:
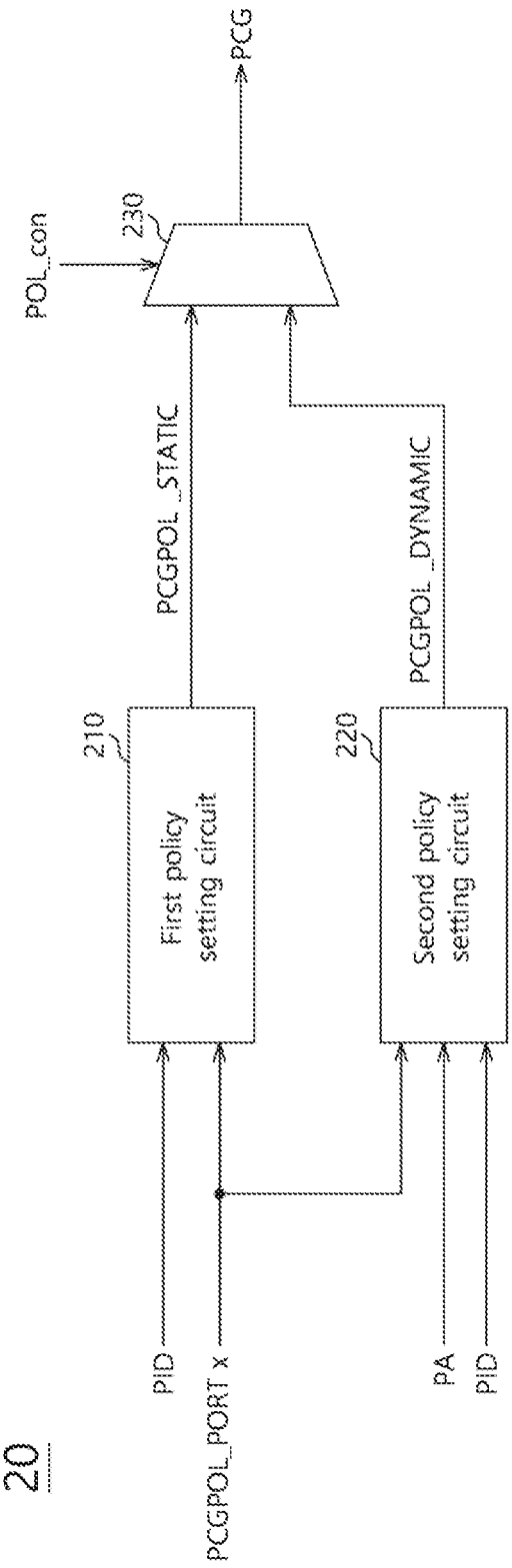
FIG. 4 is a schematic diagram illustrating a configuration of a precharge policy setting circuit in accordance with an embodiment of the present invention.

FIG. 4 is a schematic diagram illustrating a configuration of a precharge policy setting circuit in accordance with an embodiment.

Referring to FIG. 4, the precharge policy setting circuit 20 may include a first policy setting circuit 210, a second policy setting circuit 220 and a first selection circuit 230.

The first policy setting circuit 210 may be configured to generate a static precharge policy signal PCGPOL_STATIC in response to the port identifier PID and a per-port initial precharge scheme signal PCGPOL_PORTx.

The second policy setting circuit 220 may be configured to generate a dynamic precharge policy signal PCGPOL_DYNAMIC based on a generation pattern of the physical address PA, that is, whether the physical address PA is changed or not, in addition to the port identifier PID and the per-port initial precharge scheme signal PCGPOL_PORTx.

The first selection circuit 230 may be configured to output either the static precharge policy signal PCGPOL_STATIC signal or the dynamic precharge policy signal PCGPOL_DYNAMIC as the precharge signal PCG based on a policy control signal POL_con provided from the state control register (SCR). The policy control signal POL_con may indicate one of the first and second precharge policies.

In an embodiment, in the case where the policy control signal POL_con is at a first logic level, the first selection circuit 230 may output the static precharge policy signal PCGPOL_STATIC as the precharge signal PCG. In this case, a precharge policy for a row line to be accessed may be set to maintain an initial precharge scheme.

In an embodiment, in the case where the policy control signal POL_con is at a second logic level, the first selection circuit 230 may output the dynamic policy signal PCGPOL_DYNAMIC as the precharge signal PCG. In this case, a precharge policy for a row line to be accessed may be maintained or changed from the initial precharge scheme to the other precharge scheme based on an access pattern for the corresponding row line.

The memory device 130 may include a single port, and in this case, may operate in the open precharge scheme or the closed precharge scheme depending on the precharge signal PCG as determined by the precharge policy setting circuit 20 illustrated in FIG. 4.

Figure 5:
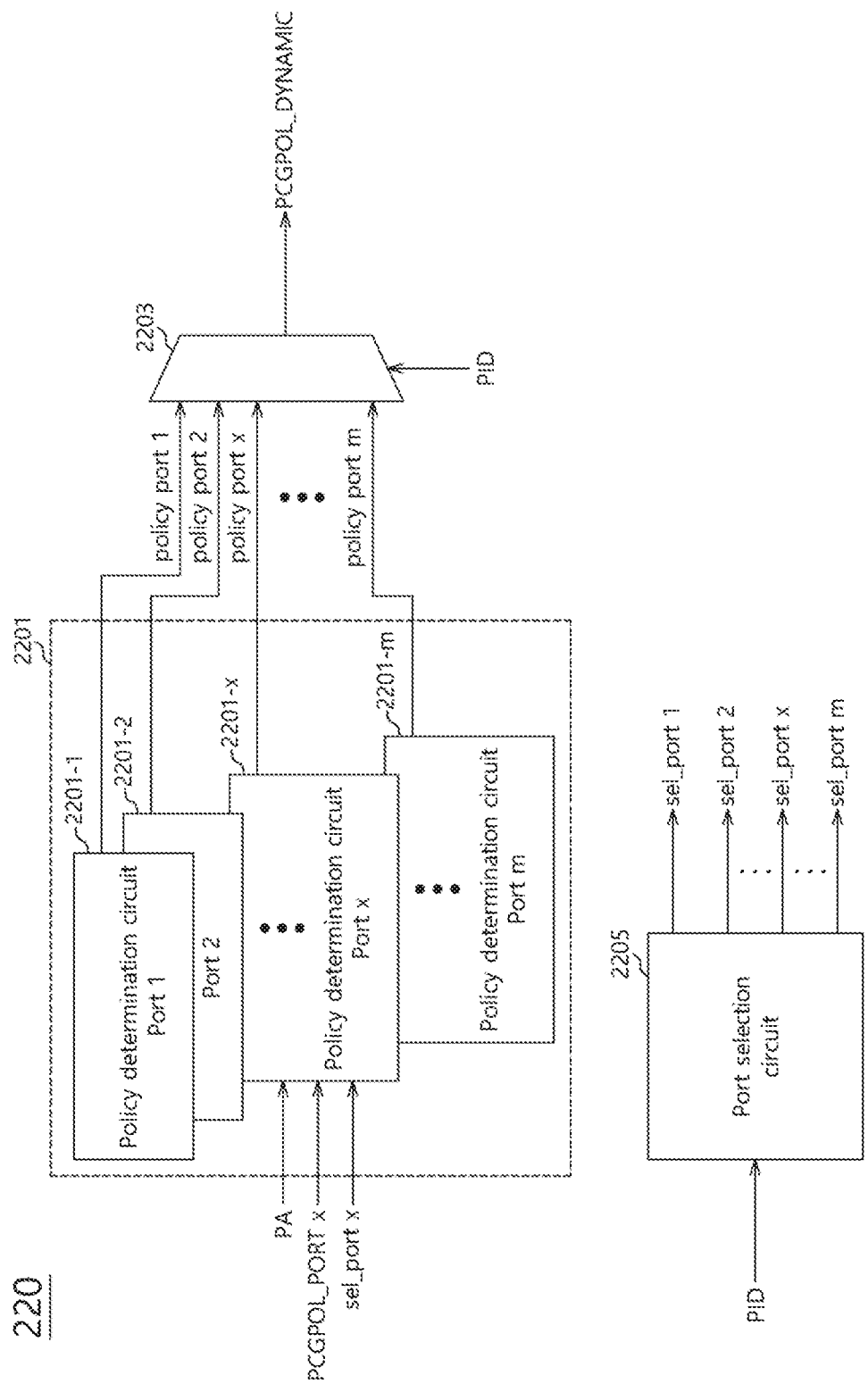
FIG. 5 is a schematic diagram illustrating a configuration of a second policy setting circuit in accordance with an embodiment of the present invention.

FIG. 5 is a schematic diagram illustrating a configuration of a second policy setting circuit in accordance with an embodiment.

Referring to FIG. 5, the second policy setting circuit 220 may include a port selection circuit 2205, a per-port policy determination circuit 2201 and a second selection circuit 2203.

The port selection circuit 2205 may generate a port select signal sel_portx based on the port identifier PID.

The per-port policy determination circuit 2201 (2201-1 to 2201-$m$) may be enabled in response to the port select signal sel_portx, and may be configured to generate a per-port policy signal portx on which a generation pattern of the physical address PA is reflected, in response to the physical address PA and the per-port initial precharge scheme signal PCGPOL_PORTx.

The second selection circuit 2203 may be configured to be provided with the per-port policy signal portx from the per-port policy determination circuit 2201 and output the per-port policy signal portx for a corresponding port as the dynamic policy signal PCGPOL_DYNAMIC based on the port identifier PID.

Figure 6:
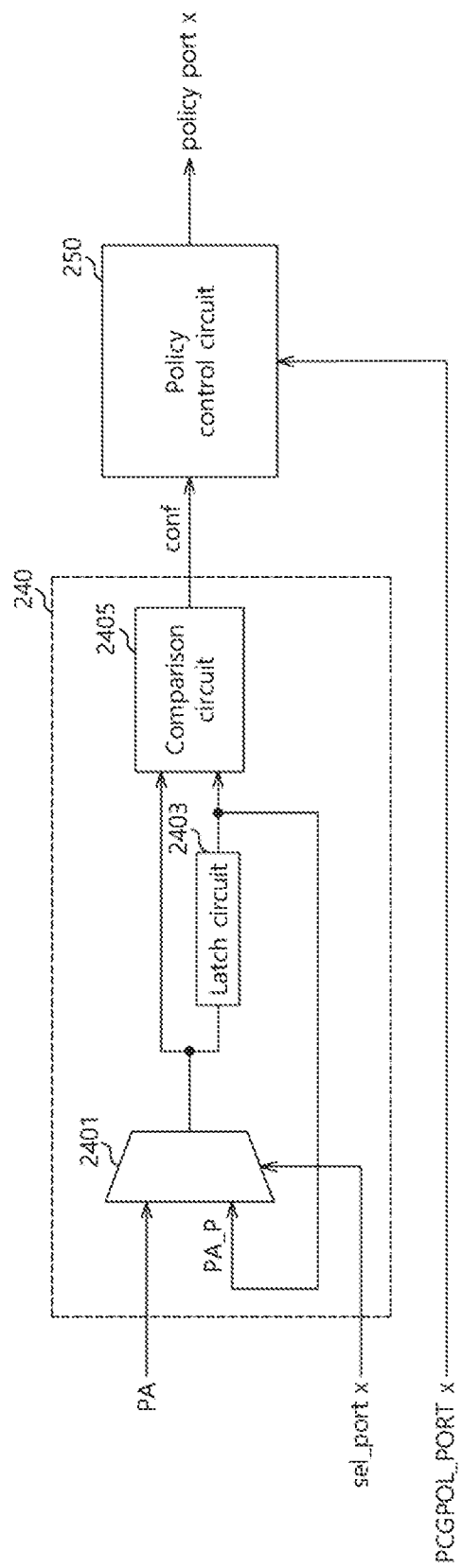
FIG. 6 is a schematic diagram illustrating a configuration of a per-port policy determination circuit in accordance with an embodiment of the present invention.

FIG. 6 is a schematic diagram illustrating a configuration of a per-port policy determination circuit in accordance with an embodiment.

Referring to FIG. 6, the per-port policy determination circuit 2201-$x$ may include an access pattern tracking circuit 240 and a policy control circuit 250.

The access pattern tracking circuit 240 may be configured to generate a pattern determination signal conf depending on a result of comparing a previously access-requested address and a currently access-requested address.

The pattern determination signal conf may be generated at any one level of first and second signal levels.

The first signal level may be a conflict signal level indicating accesses to the same page in a sub region in an active state among a plurality of sub regions constituting the memory core 1300.

The second signal level may be a non-conflict signal level indicating access to different pages in a sub region which is activated among a plurality of sub regions constituting the memory core 1300.

The policy control circuit 250 may be configured to generate the per-port policy signal portx based on the pattern determination signal conf and the per-port initial precharge scheme signal PCGPOL_PORTx.

In another viewpoint, the policy control circuit 250 may be configured to change, when the policy control signal indicates to dynamically change the current precharge scheme and the initial precharge scheme signal PCGPOL_PORTx of a specific row line is set to the open precharge scheme or the closed precharge scheme, the precharge scheme to the other precharge scheme depending on whether the corresponding row line is repeatedly accessed, temporarily accessed or intermittently accessed.

In an embodiment, the access pattern tracking circuit 240 may be configured to include an address output circuit 2401, a latch circuit 2403 and a comparison circuit 2405.

The address output circuit 2401 may be enabled depending on the port select signal sel_portx, and may be configured to be provided with a current address PA and a previous address PA_P and output the current address PA.

The latch circuit 2403 may be provided with the current address PA from the address output circuit 2401, latch the current address PA and then output the latched current address PA as the previous address PA_P.

The comparison circuit 2405 may be configured to compare the current address PA provided from the address output circuit 2401 and the previous address PA_P provided from the latch circuit 2403 and thereby output the pattern determination signal conf. The pattern determination signal conf may be referred to as an address match signal indicating whether a sub region of a current address and a sub region of a previous address are the same as each other.

The policy control circuit 250 may be provided with the per-port initial precharge scheme signal PCGPOL_PORTx and the pattern determination signal conf, and thereby, may determine a current per-port precharge scheme.

In an embodiment, the policy control circuit 250 may maintain or change the initial precharge scheme signal PCGPOL_PORTx based on a cumulative conflict count for a specific page (row line) and the initial precharge scheme signal PCGPOL_PORTx. The cumulative conflict count may represent the number of accesses to the same sub region.

Figure 7:
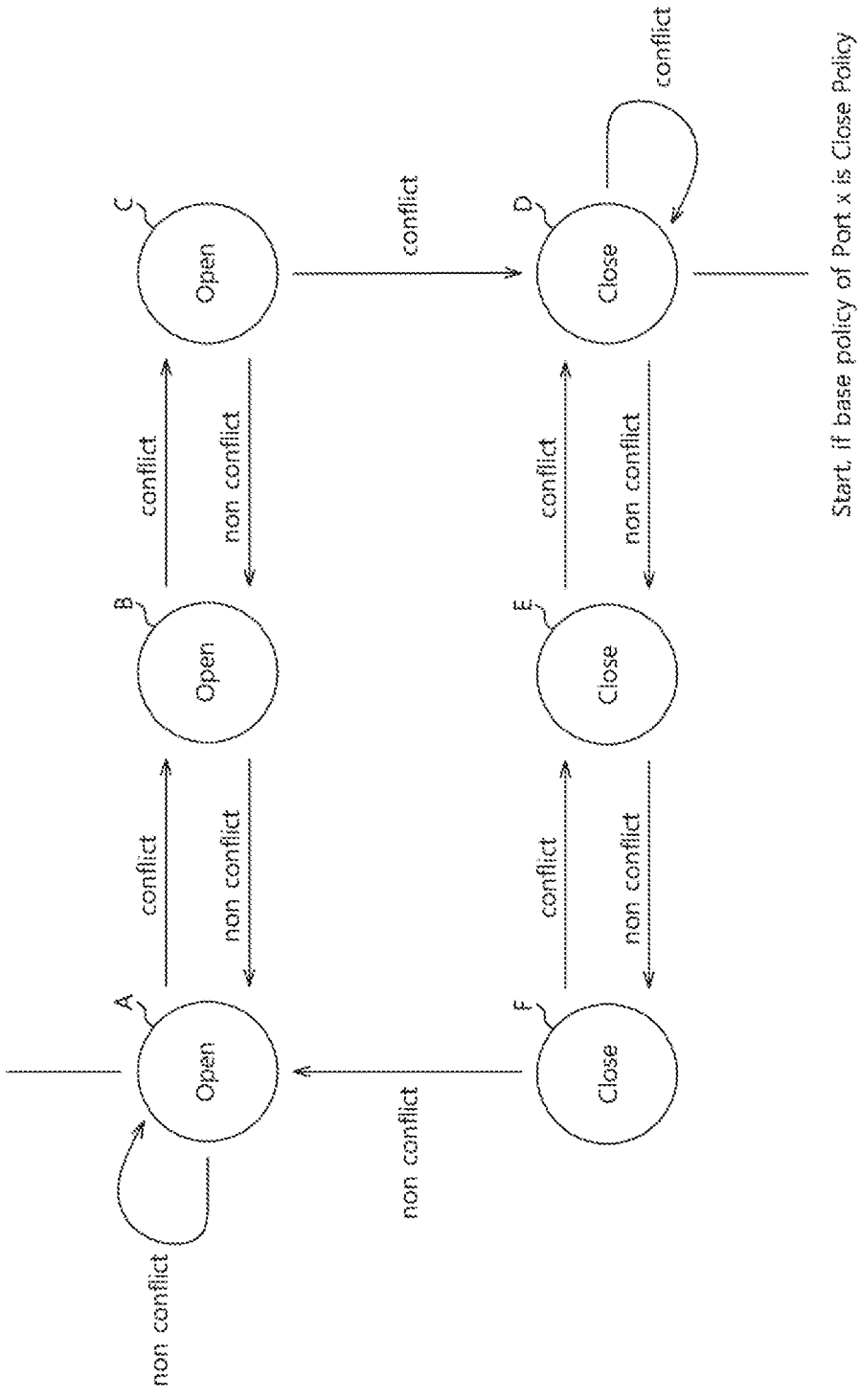
FIG. 7 is a schematic diagram illustrating a configuration of a policy control circuit in accordance with an embodiment of the present invention.

FIG. 7 is a schematic diagram illustrating a configuration of a policy control circuit in accordance with an embodiment.

Referring to FIG. 7, a policy control circuit 250-1 may be a finite state control circuit which is provided with the pattern determination signal conf and the per-port initial precharge scheme signal PCGPOL_PORTx, compares them with a current internal state, determines a next state to transition and outputs a control signal corresponding to the determined next state as the per-port policy signal portx.

In an embodiment, the policy control circuit 250-1 may start an operation from a state A, in the case where the initial precharge scheme for a specific page is the open precharge scheme. In this state, if the pattern determination signal conf is at a conflict signal level indicating a conflict of access to a corresponding sub region, the policy control circuit 250-1 maintains the initial precharge scheme and then transitions to a next state B. On the other hand, if the pattern determination signal conf is at a non-conflict signal level for a corresponding sub region, the policy control circuit 250-1 maintains the current state A.

After transitioning to the state B, if the pattern determination signal conf is at a conflict signal level, the policy control circuit 250-1 maintains the initial precharge scheme and then transitions to a next state C. In the state B, if the pattern determination signal conf is at a non-conflict signal level, the policy control circuit 250-1 transitions to the previous state A.

In the state C, if the pattern determination signal conf is at a conflict signal level, the policy control circuit 250-1 transitions to a next state D where the initial open precharge scheme is changed to the closed precharge scheme. On the other hand, in the state C, if the pattern determination signal conf is at a non-conflict signal level, the policy control circuit 250-1 returns to the previous state B.

After transitioning to the state D, if the pattern determination signal conf is at a conflict signal level, the policy control circuit 250-1 maintains the current state D, and, if the pattern determination signal conf is at a non-conflict signal level, the policy control circuit 250-1 transitions to a next state E. That is to say, after transitioning to change the precharge scheme, if the pattern determination signal conf is at a conflict signal level, the policy control circuit 250-1 maintains the current state D, and, if the pattern determination signal conf is at a non-conflict signal level, the policy control circuit 250-1 transitions to the next state E while maintaining the existing precharge scheme.

In the state E, if the pattern determination signal conf is at a conflict signal level, the policy control circuit 250-1 returns to the previous state D. On the other hand, in the state E, if the pattern determination signal conf is at a non-conflict signal level, the policy control circuit 250-1 transitions to a next state F.

In the state F, if the pattern determination signal conf is a conflict signal level, the policy control circuit 250-1 returns to the previous state E. On the other hand, in the state F, if the pattern determination signal conf is a non-conflict signal level, the policy control circuit 250-1 transitions to the next state A.

In the case where the initial precharge scheme for a specific page is the closed precharge scheme, the policy control circuit 250-1 may start an operation from the state D, and subsequent operations, which are based on the same principles, may be understood from the above description.

The finite state control circuit as the policy control circuit 250-1 illustrated in FIG. 7 may be configured to change a precharge scheme of a specific page when the access count thereto reaches a threshold, while the policy control signal POL_con indicates the second (dynamic) precharge policy. In the case where a specific page is intermittently and repeatedly accessed, the specific page is highly likely to be accessed again by a next command. Thus, for a page which is intermittently and repeatedly accessed, the finite state control circuit may be configured to maintain an initial precharge scheme and then change it when the access count to the page reaches the threshold.

In an embodiment, a depth of the finite state control circuit may be determined depending on the threshold.

Figure 8:
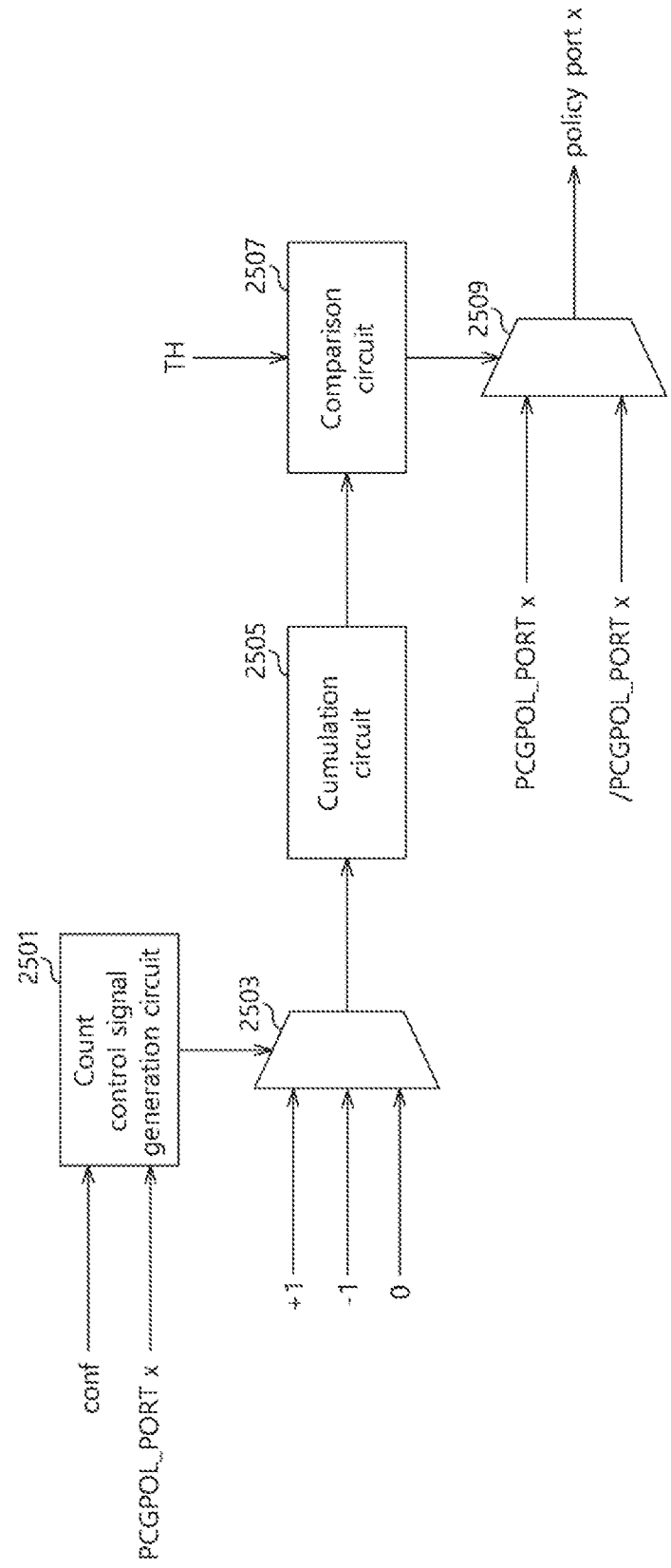
FIG. 8 is a schematic diagram illustrating a configuration of a policy control circuit in accordance with an embodiment of the present invention.

FIG. 8 is a schematic diagram illustrating a configuration of a policy control circuit in accordance with an embodiment.

Referring to FIG. 8, a policy control circuit 250-2 may be configured to include a count control signal generation circuit 2501, an augend generation circuit 2503, a cumulation circuit 2505, a comparison circuit 2507 and a selection circuit 2509.

The count control signal generation circuit 2501 may be configured to generate a count control signal in response to the pattern determination signal conf and the initial precharge scheme PCGPOL_PORTx.

The augend generation circuit 2503 may be configured to output any one of a plurality of augends +1, −1 and 0 in response to the count control signal.

The cumulation circuit 2505 may be configured to cumulatively add an augend generated in the augend generation circuit 2503.

The comparison circuit 2507 may be configured to compare a threshold TH and an output signal of the cumulation circuit 2505 and thereby generate a comparison signal.

The selection circuit 2509 may be configured to generate the initial precharge scheme signal PCGPOL_PORTx or a changed precharge scheme signal/PCGPOL_PORTx as the per-port policy signal policy portx in response to the comparison signal.

In these ways, the policy control circuits 250, 250-1 and 250-2 in accordance with the embodiments may be configured to maintain or change an initial precharge scheme depending on a cumulative access count to a specific page.

The memory device 130 described above with reference to FIGS. 1 to 8 may be a dynamic random access memory (DRAM), which activates a row line upon an access to memory cells and maintains the corresponding row line in an active state or precharges the corresponding row line, after processing data.

A DRAM itself may be used as a data storage medium in the form of a cache or buffer memory of another storage system, for example, a flash memory-based storage system.

A flash memory, having advantages of large capacity, non-volatility, a low unit cost, low power consumption and a high data processing speed, may be realized in a solid state drive (SSD) type replacing a hard disc, an embedded type capable of being used as an embedded memory for a mobile device, etc. A DRAM may be used as a working memory or a buffer memory of such a storage system.

Figure 9:
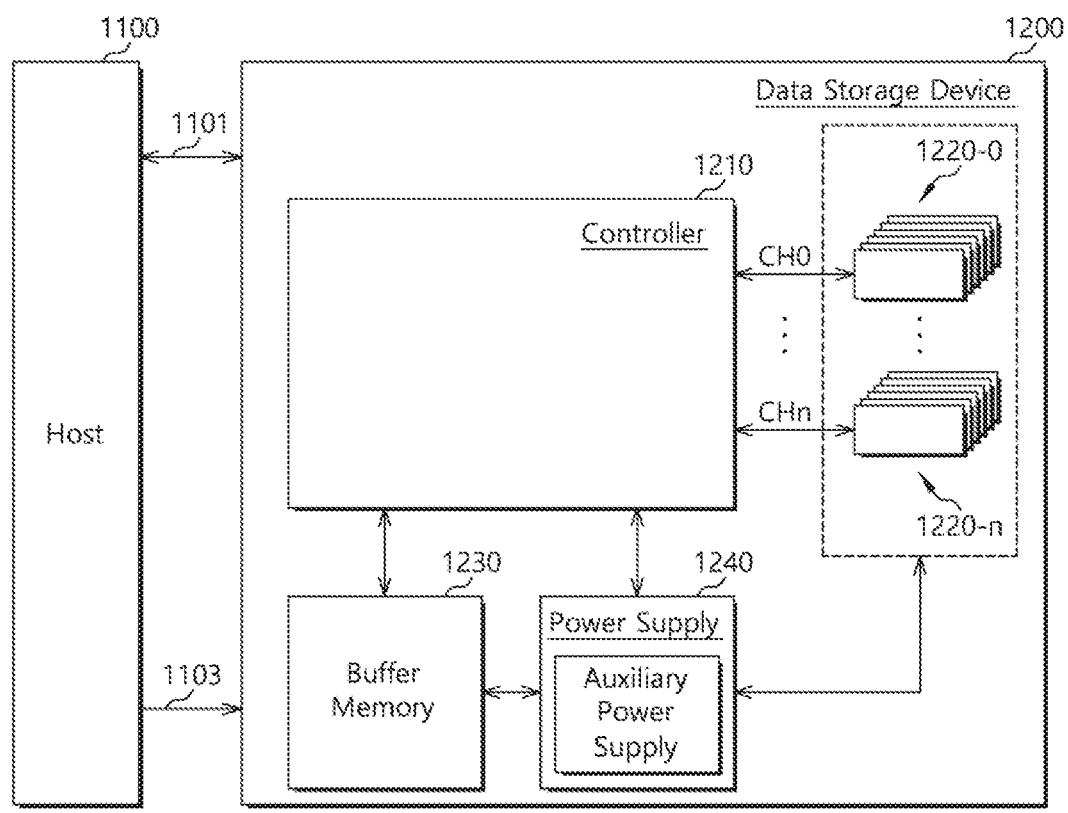
FIG. 9 is a diagram illustrating a data storage system in accordance with an embodiment of the present invention.

FIG. 9 is a diagram illustrating a data storage system 1000 in accordance with an embodiment.

Referring to FIG. 9, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface, a control component, a random access memory used as a working memory, an error correction code (ECC) component, and a memory interface. In an embodiment, the controller 1210 may configured as controller 110 shown in FIGS. 1 and 2.

The host device 1100 may exchange a signal with the data storage device 1200 through the signal connector 1101. The signal may include a command, an address, data, and the like.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to the same channel may be coupled to the same signal bus and data bus.

The power supply 1240 may provide power inputted through the power connector 1103 to the controller 1210, the nonvolatile memory devices 1220-0 to 1220-n and the buffer memory device 1230 of the data storage device 1200. The power supply 1240 may include an auxiliary power supply. The auxiliary power supply may supply power to allow the data storage device 1200 to be properly terminated when a sudden power interruption occurs. The auxiliary power supply may include bulk-capacity capacitors sufficient to store the needed charge.

The signal connector 1101 may be configured as any of various types of connectors depending on an interface scheme between the host device 1100 and the data storage device 1200.

The power connector 1103 may be configured as any of various types of connectors depending on a power supply scheme of the host device 1100.

While various embodiments have been illustrated and described herein, it will be understood to those skilled in the art that the embodiments described are examples only. Accordingly, the present invention is not limited to the described embodiments. Rather, the present invention encompasses all modifications and variations of any of the described embodiments that fall within the scope of the claims and their equivalents.

What is claimed is:

1. A data storage system comprising:
 a memory device including a plurality of memory cells which are coupled to a plurality of row lines, the memory device divided into a plurality of sub regions each including at least one of the row lines, and the memory device configured to communicate with a host device through a plurality of ports which are a communication channel between the host device and the memory device; and
 a memory controller configured to set a first precharge scheme for each of the plurality of ports, select one of a first precharge policy and a second precharge policy according to the first precharge scheme and a policy control signal, and control the row lines according to the selected precharge policy,
 wherein
 the first precharge policy is configured to set the first precharge scheme as a current precharge scheme,
 the second precharge policy is configured to maintain the first precharge scheme or charge to another precharge scheme to set the current precharge scheme, and
 the memory controller is configured to maintain or change the current precharge scheme to the other precharge scheme based on an access count for a sub region in which a specific row line is included.

2. The data storage system according to claim 1,
 wherein the memory controller comprises:
 a first policy setting circuit configured to generate a static precharge policy signal based on the first precharge scheme;
 a second policy setting circuit configured to generate a dynamic precharge policy signal based on the current precharge scheme and an access address for the row lines; and
 a first selection circuit configured to output a precharge signal by selecting one of the static precharge policy signal and the dynamic precharge policy signal depending on the policy control signal, and wherein the second policy setting circuit comprises:

an access pattern tracking circuit configured to generate a pattern determination signal by comparing a previously requested access address and a currently requested access address; and a policy control circuit configured to output the dynamic precharge policy signal based on the pattern determination signal and the current precharge scheme.

3. The data storage system according to claim 2, wherein the first policy setting circuit is configured to generate the static precharge policy signal in response to a port identifier, the first precharge scheme per each of the plurality of ports, wherein the second policy setting circuit is provided for each of the plurality of ports, and is configured to generate the dynamic precharge policy signal for each of the plurality of ports, based on the port identifier, the current precharge scheme per each of the plurality of ports and the access address, and wherein the memory controller comprises:

a port selection circuit configured to generate a port select signal based on the port identifier; and a second selection circuit configured to select one of the precharge policy signals for the plurality of ports, in response to the port select signal.

4. The data storage system according to claim 2, wherein the policy control circuit is configured to determine a next state to which to transition based on a current internal state, the pattern determination signal and the current precharge scheme, and output a control signal corresponding to the determined next state as the dynamic precharge policy signal.

5. The data storage system according to claim 2, wherein the policy control circuit comprises:

a count control signal generation circuit configured to generate a count control signal in response to the pattern determination signal and the current precharge scheme;

an augend generation circuit configured to output any one of a plurality of augends in response to the count control signal;

a cumulation circuit configured to cumulatively add an augend generated in the augend generation circuit;

a comparison circuit configured to generate a comparison signal by comparing a threshold and an output signal of the cumulation circuit; and a selection circuit configured to generate the dynamic precharge policy signal indicating one of the current precharge scheme and the other precharge scheme.

6. The data storage system according to claim 1, wherein the first precharge scheme is configured to be selected from one of an open precharge scheme of maintaining the specific row line in an active state, and a closed precharge scheme of precharging the specific row line of an active state.

7. A precharge policy setting method of a data storage system including a memory device which includes a plurality of memory cells coupled to a plurality of row lines, the memory device divided into a plurality of sub regions each including at least one of the row lines, and the memory device communicating with a host device through a plurality of ports which are a communication channel between the host device and the memory device, the method comprising:

setting a first precharge scheme for each of the plurality of ports;

selecting one of a first precharge policy and a second precharge policy according to the first precharge scheme and a policy control signal; and controlling the row lines according to the selected precharge policy, wherein the first precharge policy is configured to set the first precharge scheme as a current precharge scheme, the second precharge policy is configured to maintain the first precharge scheme or change to another precharge scheme to set the current precharge scheme, and the method further comprises maintaining or changing the current precharge scheme to the other precharge scheme based on an access count for a sub region in which a specific row line is included.

8. The precharge policy setting method according to claim 7, wherein the controlling includes dynamically changing the current precharge scheme set for each of the plurality of ports based on whether an access address is changed or not for a corresponding one of the ports.

9. The precharge policy setting method according to claim 7, wherein the first precharge scheme is configured to be selected from one of an open precharge scheme of maintaining the specific row line in an active state, and a closed precharge scheme of precharging the specific row line to an active state.

* * * * *